(12) United States Patent
Li et al.

(10) Patent No.: US 12,520,603 B2
(45) Date of Patent: Jan. 6, 2026

(54) REFLECTIVE GRID FOR PHOTOVOLTAIC MODULE FILM AND PROCESS

(71) Applicant: Dow Global Technologies LLC, Midland, MI (US)

(72) Inventors: Yuyan Li, Shanghai (CN); Yunlong Guo, Shanghai (CN); Yabin Sun, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 30 days.

(21) Appl. No.: 18/559,878

(22) PCT Filed: May 28, 2021

(86) PCT No.: PCT/CN2021/096927
§ 371 (c)(1),
(2) Date: Nov. 9, 2023

(87) PCT Pub. No.: WO2022/246835
PCT Pub. Date: Dec. 1, 2022

(65) Prior Publication Data
US 2025/0113622 A1    Apr. 3, 2025

(51) Int. Cl.
*H10F 19/80* (2025.01)
*H10F 71/00* (2025.01)
*H10F 77/42* (2025.01)

(52) U.S. Cl.
CPC ......... *H10F 19/804* (2025.01); *H10F 19/807* (2025.01); *H10F 71/00* (2025.01); *H10F 77/488* (2025.01)

(58) Field of Classification Search
CPC ...... H10F 19/804; H10F 77/488; H10F 71/00; H10F 19/807
See application file for complete search history.

(56) References Cited

U.S. PATENT DOCUMENTS

| | | |
|---|---|---|
| 2012/0295101 A1 | 11/2012 | Tanaka |
| 2013/0133726 A1 | 5/2013 | Graichen et al. |

(Continued)

FOREIGN PATENT DOCUMENTS

| | | |
|---|---|---|
| CN | 106945378 A | 7/2017 |
| CN | 207183291 U | 4/2018 |

(Continued)

OTHER PUBLICATIONS

Zhan et al., CN 110828595 A, English Machine Translation. (Year: 2020).*

(Continued)

*Primary Examiner* — Tae-Sik Kang
(74) *Attorney, Agent, or Firm* — Boyle Fredrickson S. C.

(57) ABSTRACT

The present disclosure provides a process. In an embodiment, the process includes providing an aqueous pigment-polyolefin dispersion (P-P dispersion) and applying a grid-pattern of the aqueous P-P dispersion onto a rear encapsulant film. The process includes drying the grid-pattern into a grid layer to form a gridded rear encapsulant film. The process includes placing a plurality of photovoltaic cells and a front encapsulant film onto the gridded rear encapsulant film to form a stack, and laminating the stack to form a reflective photovoltaic (PV) module. The present disclosure also provides a reflective photovoltaic module produced by the process.

9 Claims, 2 Drawing Sheets

(56) References Cited

U.S. PATENT DOCUMENTS

| | | | |
|---|---|---|---|
| 2014/0332073 A1* | 11/2014 | Chen | ................... H10F 19/80 |
| | | | 136/258 |
| 2015/0007886 A1 | 1/2015 | Takegami | |
| 2015/0027535 A1 | 1/2015 | Hong et al. | |
| 2015/0295101 A1 | 10/2015 | Potter | |
| 2016/0083908 A1 | 3/2016 | Wang et al. | |
| 2017/0117425 A1* | 4/2017 | Asbeck | ................ H10F 77/48 |
| 2020/0028011 A1 | 1/2020 | Lin et al. | |

FOREIGN PATENT DOCUMENTS

| | | | | |
|---|---|---|---|---|
| CN | 109536072 A | | 3/2019 | |
| CN | 208667573 U | | 3/2019 | |
| CN | 109796806 A | * | 5/2019 | |
| CN | 110537140 A | | 12/2019 | |
| CN | 110776842 A | | 2/2020 | |
| CN | 110828595 A | * | 2/2020 | .......... H01L 31/049 |
| CN | 111403522 A | | 7/2020 | |
| CN | 11718661 A | | 9/2020 | |
| CN | 111718661 A | | 9/2020 | |
| CN | 111725346 A | | 9/2020 | |
| CN | 211670198 U | | 10/2020 | |
| CN | 212342643 A | | 1/2021 | |
| CN | 112831291 A | | 5/2021 | |
| JP | 2006-073707 A | | 3/2006 | |
| JP | 2010-287688 A | | 12/2010 | |

OTHER PUBLICATIONS

Zhang et al., CN 109796806 A, English Machine Translation. (Year: 2019).*

* cited by examiner

REFLECTIVE GRID FOR PHOTOVOLTAIC MODULE FILM AND PROCESS

BACKGROUND

Photovoltaic (PV) modules are characterized by the efficiency with which they can convert incident solar power to useful electric power. PV modules utilizing crystalline silicon photovoltaic cells have achieved efficiencies of about 23.5% or greater.

A known approach for increasing PV module efficiency is the provision of a reflective layer in the PV module to enhance light reflection. Conventional techniques for adding a reflective layer to a PV module include (i) melt bonding reflective material to encapsulant film, (ii) adding additional structural layers such as reflective backsheet to the PV module, and adding tie layers to achieve (i) and/or (ii). These conventional approaches impart complicated chemistries and/or additional structural requirements to the PV module.

It is also known that the PV module fabrication process is slow and cumbersome, PV module fabrication requiring a lamination procedure that is very energy-intensive and time consuming. The lamination step is typically the bottleneck in the PV module fabrication process. The burdens in the foregoing conventional techniques for producing reflective layer fail to mediate the problems of PV module fabrication and merely compound the drawbacks of PV module fabrication.

The art recognizes the need for a simplified technique for adding a reflective layer to a PV module that reduces PV fabrication time, reduces PV module production energy, and reduces PV module material costs.

SUMMARY

The present disclosure provides a process. In an embodiment, the process includes providing an aqueous pigment-polyolefin dispersion (P-P dispersion) and applying a grid-pattern of the aqueous P-P dispersion onto a rear encapsulant film. The process includes drying the grid-pattern into a grid layer to form a gridded rear encapsulant film.

The present disclosure provides a photovoltaic (PV) module. In an embodiment, the PV module includes a gridded rear encapsulant film, a front encapsulant film, and a plurality of photovoltaic cells sandwiched between the gridded rear encapsulant film and the front encapsulant film. The gridded rear encapsulant film has a facial surface and a grid layer adhered to the facial surface. The grid layer has (i) a grid area that is a reflective material composed of a polyolefin and a pigment, and (ii) a plurality of land areas defined by the grid area. Each land area is void of the reflective material. The PV module includes a plurality of photovoltaic cells, each photovoltaic cell is located on a respective land area.

DEFINITIONS

Figure 1:
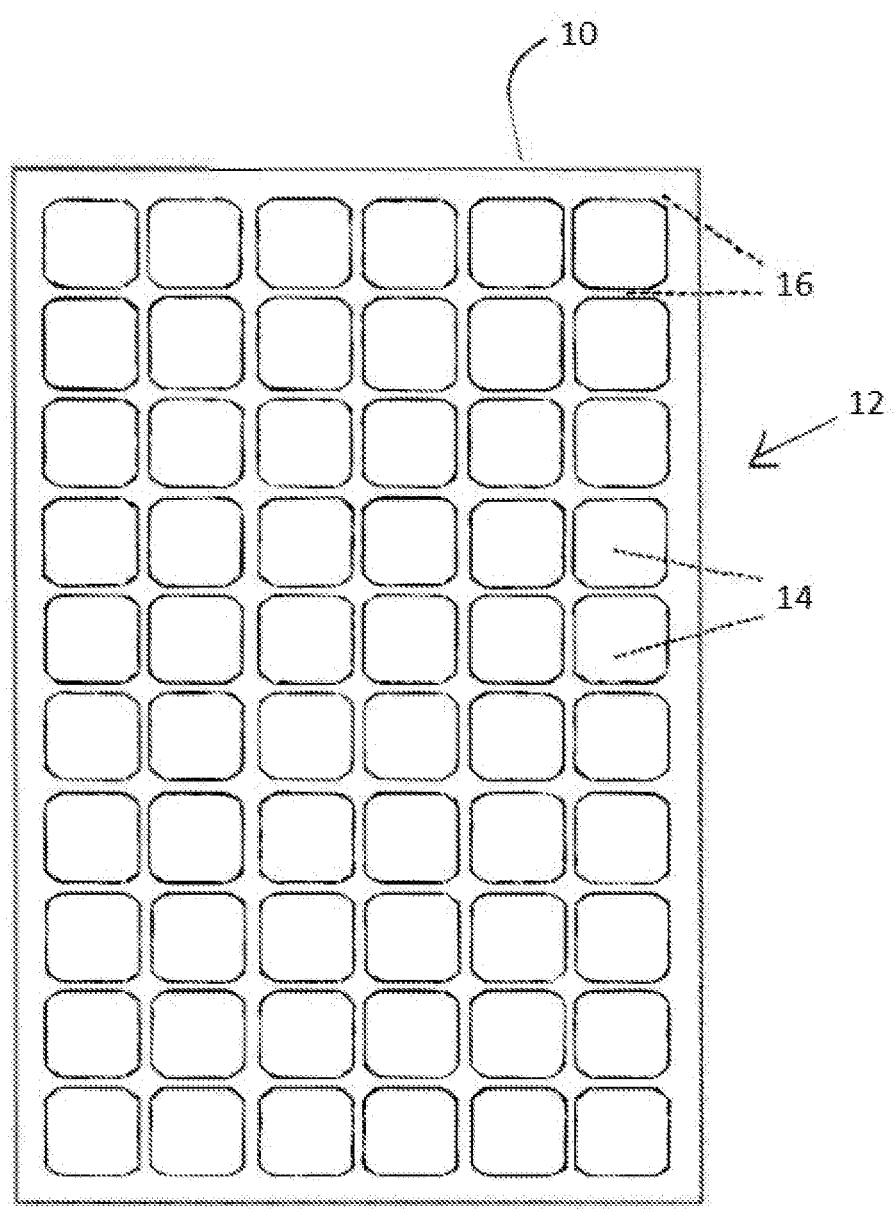
FIG. 1 is a top plan view of a grid layer of reflective material on a facial surface of a rear encapsulant film in accordance with an embodiment of the present disclosure.

Any reference to the Periodic Table of Elements is that as published by CRC Press, Inc., 1990-1991. Reference to a group of elements in this table is by the new notation for numbering groups.

For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1 or 2, or 3 to 5, or 6, or 7), any subrange between any two explicit values is included (e.g., the range 1-7 above includes subranges of from 1 to 2; from 2 to 6; from 5 to 7; from 3 to 7; from 5 to 6; etc.).

Unless stated to the contrary, implicit from the context, or customary in the art, all parts and percents are based on weight and all test methods are current as of the filing date of this disclosure.

The terms "blend" or "polymer blend," as used herein, is a blend of two or more polymers. Such a blend may or may not be miscible (not phase separated at molecular level). Such a blend may or may not be phase separated. Such a blend may or may not contain one or more domain configurations, as determined from transmission electron spectroscopy, light scattering, x-ray scattering, and other methods known in the art.

The term "composition" refers to a mixture of materials which comprise the composition, as well as reaction products and decomposition products formed from the materials of the composition.

The terms "comprising," "including," "having" and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term "consisting essentially of" excludes from the scope of any succeeding recitation any other component, step, or procedure, excepting those that are not essential to operability. The term "consisting of" excludes any component, step, or procedure not specifically delineated or listed. The term "or," unless stated otherwise, refers to the listed members individually as well as in any combination. Use of the singular includes use of the plural and vice versa.

"Elastomer" and like terms refer to a rubber-like polymer that can be stretched to at least twice its original length and which retracts very rapidly to approximately its original length when the force exerting the stretching is released. An elastomer has an elastic modulus of about 10,000 psi (68.95 MPa) or less and an elongation usually greater than 200% in the uncrosslinked state at room temperature using the method of ASTM D638-72.

An "ethylene elastomer" and like terms refer to an elastomer composed of an ethylene-based polymer.

An "ethylene-based polymer" is a polymer that contains more than 50 weight percent (wt %) polymerized ethylene monomer (based on the total amount of polymerizable monomers) and, optionally, may contain at least one comonomer. Ethylene-based polymer includes ethylene homopolymer, and ethylene copolymer (meaning units derived from ethylene and one or more comonomers). The terms "ethylene-based polymer" and "polyethylene" may be used interchangeably. Nonlimiting examples of ethylene-based polymer (polyethylene) include low density polyethylene (LDPE) and linear polyethylene. Nonlimiting examples of linear polyethylene include linear low density polyethylene (LLDPE), ultra low density polyethylene (ULDPE), very low density polyethylene (VLDPE), multi-component ethylene-based copolymer (EPE), ethylene/α-olefin multi-block copolymers (also known as olefin block copolymer (OBC)), substantially linear, or linear, plastomers/elastomers, and high density polyethylene (HDPE). Generally, polyethylene may be produced in gas-phase, fluidized bed reactors, liquid phase slurry process reactors, or liquid phase solution process reactors, using a heterogeneous catalyst system, such as Ziegler-Natta catalyst, a homogeneous catalyst system, comprising Group 4 transition metals and ligand structures such as metallocene, non-metallocene metal-centered, heteroaryl, heterovalent aryloxyether, phosphinimine, and others. Combinations of heterogeneous and/or homogeneous catalysts also may be used in either single reactor or dual reactor configurations.

"Ethylene plastomers/elastomers" are substantially linear, or linear, ethylene/α-olefin copolymers containing homogeneous short-chain branching distribution comprising units derived from ethylene and units derived from at least one $C_3$-$C_{10}$ α-olefin comonomer. Ethylene plastomers/elastomers have a density from 0.870 g/cc to 0.917 g/cc. Nonlimiting examples of ethylene plastomers/elastomers include AFFINITY™ plastomers and elastomers (available from The Dow Chemical Company), EXACT™ Plastomers (available from ExxonMobil Chemical), Tafmer™ (available from Mitsui), Nexlene™ (available from SK Chemicals Co.), and Lucene™ (available LG Chem Ltd.).

"High density polyethylene" (or "HDPE") is an ethylene homopolymer or an ethylene/α-olefin copolymer with at least one $C_4$-$C_{10}$ α-olefin comonomer, or $C_4$-$C_8$ α-olefin comonomer and a density from 0.940 g/cc, or 0.945 g/cc, or 0.950 g/cc, 0.953 g/cc to 0.955 g/cc, or 0.960 g/cc, or 0.965 g/cc, or 0.970 g/cc, or 0.975 g/cc, or 0.980 g/cc. The HDPE can be a monomodal copolymer or a multimodal copolymer. A "monomodal ethylene copolymer" is an ethylene/$C_4$-$C_{10}$ α-olefin copolymer that has one distinct peak in a gel permeation chromatography (GPC) showing the molecular weight distribution. A "multimodal ethylene copolymer" is an ethylene/$C_4$-$C_{10}$ α-olefin copolymer that has at least two distinct peaks in a GPC showing the molecular weight distribution. Multimodal includes copolymer having two peaks (bimodal) as well as copolymer having more than two peaks. Nonlimiting examples of HDPE include DOW™ High Density Polyethylene (HDPE) Resins (available from The Dow Chemical Company), ELITE™ Enhanced Polyethylene Resins (available from The Dow Chemical Company), CONTINUUM™ Bimodal Polyethylene Resins (available from The Dow Chemical Company), LUPOLEN™ (available from LyondellBasell), as well as HDPE products from *Borealis*, Ineos, and ExxonMobil.

"Low density polyethylene" (or "LDPE") consists of ethylene homopolymer, or ethylene/α-olefin copolymer comprising at least one $C_3$-$C_{10}$ α-olefin that has a density from 0.915 g/cc to less than 0.940 g/cc and contains long chain branching with broad MWD. LDPE is typically produced by way of high pressure free radical polymerization (tubular reactor or autoclave with free radical initiator). Nonlimiting examples of LDPE include MarFlex™ (Chevron Phillips), LUPOLEN™ (LyondellBasell), as well as LDPE products from *Borealis*, Ineos, ExxonMobil, and others.

"Unear low density polyethylene" (or "LLDPE") is a linear ethylene/α-olefin copolymer containing heterogeneous short-chain branching distribution comprising units derived from ethylene and units derived from at least one $C_3$-$C_{10}$ α-olefin comonomer. LLDPE is characterized by little, if any, long chain branching, in contrast to conventional LDPE. LLDPE has a density from 0.910 g/cc to less than 0.940 g/cc. Nonlimiting examples of LLDPE include TUFUN™ linear low density polyethylene resins (available from The Dow Chemical Company), DOWLEX™ polyethylene resins (available from the Dow Chemical Company), and MARLEX™ polyethylene (available from Chevron Phillips).

An "olefin-based polymer" or "polyolefin" is a polymer that contains more than 50 weight percent polymerized olefin monomer (based on total amount of polymerizable monomers), and optionally, may contain at least one comonomer. Nonlimiting examples of olefin-based polymers include ethylene-based polymer and propylene-based polymer.

A "polymer" is a compound prepared by polymerizing monomers, whether of the same or a different type, that in polymerized form provide the multiple and/or repeating "units" or "mer units" that make up a polymer. The generic term polymer thus embraces the term homopolymer, usually employed to refer to polymers prepared from only one type of monomer, and the term copolymer, usually employed to refer to polymers prepared from at least two types of monomers. It also embraces all forms of copolymer, e.g., random, block, etc. The terms "ethylene/α-olefin polymer" and "propylene/α-olefin polymer" are indicative of copolymer as described above prepared from polymerizing ethylene or propylene respectively and one or more additional, polymerizable α-olefin monomer. It is noted that although a polymer is often referred to as being "made of" one or more specified monomers, "based on" a specified monomer or monomer type, "containing" a specified monomer content, or the like, in this context the term "monomer" is understood to be referring to the polymerized remnant of the specified monomer and not to the unpolymerized species. In general, polymers herein are referred to has being based on "units" that are the polymerized form of a corresponding monomer.

A "propylene-based polymer" is a polymer that contains more than 50 weight percent polymerized propylene monomer (based on the total amount of polymerizable monomers) and, optionally, may contain at least one comonomer. Propylene-based polymer includes propylene homopolymer, and propylene copolymer (meaning units derived from propylene and one or more comonomers). The terms "propylene-based polymer" and "polypropylene" may be used interchangeably. Nonlimiting examples of suitable propylene copolymer include propylene impact copolymer and propylene random copolymer.

"Ultra low density polyethylene" (or "ULDPE") and "very low density polyethylene" (or "VLDPE") each is a linear ethylene/α-olefin copolymer containing heterogeneous short-chain branching distribution comprising units derived from ethylene and units derived from at least one $C_3$-$C_{10}$ α-olefin comonomer. ULDPE and VLDPE each has a density from 0.885 g/cc to 0.915 g/cc. Nonlimiting examples of ULDPE and VLDPE include ATTANE™ ultra low density polyethylene resins (available from The Dow Chemical Company) and FLEXOMER™ very low density polyethylene resins (available from The Dow Chemical Company).

TEST METHODS

Average volume particle diameter refers to a volume mean particle size, as measured using a Beckman LS230 Particle Size Analyzer, with results reported in micrometers (or microns).

Current-voltage (IV) characteristics of PV module samples were evaluated with a pulsed solar simulator (Burger PS8/PSS8) with procedures described in IEC 60904. The light intensity was set to 1000 W/m². The instrument was calibrated using a standard module calibrated at CPVT. The short-circuit current (ISC), the open-circuit voltage (VOC), the fill factor (FF) and Maximum power output (Pmax) are all parameters determined from the IV curve. The obtained Pmax was used as the initial power output of the PV modules, with results reported in Watt-peak (W).

Density is measured in accordance with ASTM D792, Method B. The result is recorded in grams per cubic centimeter (g/cc).

Differential Scanning Calorimetry (DSC)

Differential Scanning Calorimetry (DSC) can be used to measure the melting, crystallization, and glass transition behavior of a polymer over a wide range of temperature. For example, the TA Instruments Q1000 DSC, equipped with an RCS (refrigerated cooling system) and an autosampler is used to perform this analysis. During testing, a nitrogen purge gas flow of 50 ml/min is used. Each sample is melt pressed into a thin film at about 175° C.; the melted sample is then air-cooled to room temperature (about 25° C.). A 3-10 mg, 6 mm diameter specimen is extracted from the cooled polymer, weighed, placed in a light aluminum pan (ca 50 mg), and crimped shut. Analysis is then performed to determine its thermal properties.

The thermal behavior of the sample is determined by ramping the sample temperature up and down to create a heat flow versus temperature profile. First, the sample is rapidly heated to 180° C. and held isothermal for 3 minutes in order to remove its thermal history. Next, the sample is cooled to −40° C. at a 10° C./minute cooling rate and held isothermal at −40° C. for 3 minutes. The sample is then heated to 180° C. (this is the "second heat" ramp) at a 10° C./minute heating rate. The cooling and second heating curves are recorded. The cool curve is analyzed by setting baseline endpoints from the beginning of crystallization to −20° C. The heat curve is analyzed by setting baseline endpoints from −20° C. to the end of melt. The values determined are extrapolated onset of melting, Tm, and extrapolated onset of crystallization, Tc. Heat of fusion ($H_f$) (in Joules per gram), and the calculated % crystallinity for polyethylene samples using the following Equation: % Crystallinity=(($H_f$)/292 J/g)×100

The heat of fusion ($H_f$) (also known as melt enthalpy) and the peak melting temperature are reported from the second heat curve.

Melting point, Tm, is determined from the DSC heating curve by first drawing the baseline between the start and end of the melting transition. A tangent line is then drawn to the data on the low temperature side of the melting peak. Where this line intersects the baseline is the extrapolated onset of melting (Tm). This is as described in Bernhard Wunderlich, *The Basis of Thermal Analysis, in Thermal Characterization of Polymeric Materials* 92, 277-278 (Edith A. Turi ed., 2d ed. 1997).

Glass transition temperature, Tg, is determined from the DSC heating curve where half the sample has gained the liquid heat capacity as described in Bernhard Wunderlich, *The Basis of Thermal Analysis, in Thermal Characterization of Polymeric Materials* 92, 278-279 (Edith A. Turi ed., 2d ed. 1997). Baselines are drawn from below and above the glass transition region and extrapolated through the Tg region. The temperature at which the sample heat capacity is half-way between these baselines is the Tg.

Melt index (MI) (I2) in g/10 min is measured using ASTM D1238 (190° C./2.16 kg).

Melt flow rate (MFR) in g/10 min is measured using ASTM D1238 (230° C./2.16 kg)

DETAILED DESCRIPTION

1. Process

The present disclosure provides a process. In an embodiment, the process includes mixing an aqueous pigment dispersion with an aqueous polyolefin dispersion to form an aqueous pigment-polyolefin dispersion (P-P dispersion). The process includes applying a grid-pattern of the aqueous P-P dispersion onto a rear encapsulant film. The process includes drying the grid pattern into a grid layer to form a gridded rear encapsulant film.

In an embodiment, the process includes providing an aqueous polyolefin dispersion and providing an aqueous pigment dispersion. The process includes mixing the aqueous pigment dispersion with an aqueous polyolefin dispersion to form an aqueous pigment-polyolefin dispersion (P-P dispersion).

The aqueous pigment dispersion is mixed with an aqueous polyolefin dispersion. An "aqueous polyolefin dispersion," as used herein, is a dispersion composed of (i) water, (ii) particles of one or more polyolefins (or "polyolefin particles"), (iii) one or more dispersing agents composed of a carboxylic acid, carboxylic acid ester, and/or a salt of at least one carboxylic acid, and (iv) the polyolefin particles have a volume average particle size from 0.1 microns to 5.0 microns, or from 0.1 microns to 3.0 microns, or from 0.1 microns to 2.0 microns, or from 0.3 to 1.5 microns, or from 0.5 microns to 1.4 microns.

Nonlimiting examples of suitable polyolefins include propylene-based polymer (propylene/ethylene copolymer, propylene/$C_4$-$C_8$ α-olefin copolymer), ethylene-based polymer, and ethylene/propylene/diene terpolymer (ethylene/propylene/ethylidene norbornene terpolymer (ENB)). Nonlimiting examples of suitable ethylene-based polymer includes ethylene elastomer, ethylene/$C_3$-$C_8$ α-olefin copolymer, ethylene/$C_4$-$C_8$ α-olefin copolymer, linear low density polyethylene, ethylene/$C_4$-$C_8$ α-olefin multi-block copolymer, functionalized ethylene-based polymer (maleic andhydride (MAH) ethylene-based polymer) and combinations thereof.

In an embodiment, the aqueous polyolefin dispersion is composed of (i) water, (ii) particles of an ethylene-based polymer, alone or in combination with particles of a propylene-based polymer, (iii) a dispersing agent selected from a long chain $C_{12}$-$C_{40}$ fatty acid, ethylene acrylic acid, sulfonic acid salt, and any combination thereof, and the particles of the ethylene-based polymer (alone or in combination with the propylene-based polymer particles) have a volume average particle size from 0.1 microns to 5.0 microns, or from 0.1 microns to 3.0 microns, or from 0.1 microns to 2.0 microns, or from 0.3 microns to 1.5 microns, or from 0.3 microns to 1.5 microns, or from 0.5 microns to 1.4 microns.

With selection of the dispersing agent, it is possible to control, or otherwise modify the following characteristics: (i) dispersion particle size, (ii) film formation characteristics, (iii) shear and shelf stability, (iv) wettability (the ability to flow onto a substrate without drawing back or beading on the substrate); and (v) adhesion to a substrate.

The aqueous polyolefin dispersion may be prepared by a continuous twin screw extrusion process as described in U.S. Pat. Nos. 8,318,257; 7,947,776; or U.S. Pat. No. 7,803,865. The mechanical dispersion technology includes a twin-screw extruder coupled to a back pressure regulator, a melt pump, or a gear pump. A base reservoir and an initial water reservoir, each of which include a pump. Desired amounts of base and initial water are provided from the base reservoir and the initial water reservoir. Polyolefin (i.e., ethylene-based polymer resin or propylene-based polymer resin) and dispersing agent are loaded into the twin-screw extruder (TSE) coupled to the back pressure regulator, with back pressure from 1.5 MPa to 2.5 MPa, or 2.0 MPa. Ethylene-based polymer resin (or propylene-based polymer resin), and the dispersing agent are melted and blended and subsequently injected with potassium hydroxide (KOH) solution and a small volume of initial water in TSE at temperature of 150° C. and 600 rpm screw rotation. A high internal phase emulsion (HIPE) is formed during this process and then diluted to from 40 wt % to 60 wt % before back pressure valve. After emulsion cooling down below 100° C., the output is transferred to a container for collecting the dispersion of microparticles composed of the ethylene-based polymer resin or the propylene-based resin.

In an embodiment, the microparticles are composed of a propylene/ethylene copolymer (and dispersing agent). The propylene/ethylene copolymer has one, some, or all of the following properties:
  (i) a density from 0.850 g/cc to 0.9 g/cc, or from 0.870 g/cc to 0.880 g/cc; and/or
  (ii) a MFR from 6.0 g/10 min to 10.0 g/10 min; and
  (iii) the particles have an average volume diameter from 0.1 microns to 2.0 microns.

In an embodiment, the microparticles are composed of an ethylene/propylene/ENB terpolymer (and dispersing agent). The ethylene/propylene/ENB terpolymer has one, some, or all of the following properties:
  (i) from 65 wt % to 75 wt % ethylene and from 4.0 wt % to 6.0 wt % ENB; and/or
  (ii) a Mooney viscosity from 20 MU to 30 MU; and/or
  (iii) the particles have an average volume diameter from 0.1 microns to 2.0 microns, or from 0.3 to 1.5 microns, or from 0.5 microns to 1.4 microns.

In an embodiment, the microparticles are composed of an ethylene/octene multi-block copolymer (and dispersing agent). The ethylene/octene multi-block copolymer copolymer (consisting only of ethylene and octene comonomer) has one, some, or all of the following properties:
  (i) a Mw/Mn from 1.7 to 3.5 or from 1.8 to 2.5; and/or
  (ii) a density from 0.860 g/cc to 0.890 g/cc, or from 0.870 g/cc, or 0.880 g/cc; and/or
  (iii) a melting point, Tm, from 118° C. to 125° C., or from 120° C. to 123° C.; and/or
  (iv) a melt index (MI) from 0.5 g/10 min to 10.0 g/10 min, or from 1.0 g/10 min to 6 g/10 min; and
  (v) the particles have an average volume diameter from 0.1 microns to 2.0 microns, or from 0.3 to 1.5 microns, or from 0.5 microns to 1.4 microns.

In an embodiment, the microparticles are composed of an ethylene-based polymer that is an ethylene/octene copolymer (and dispersing agent). The ethylene/octene copolymer has one, some, or all of the following properties:
  (i) a density from 0.850 g/cc to 0.90 g/cc, or from 0.860 g/cc to 0.880 g/cc; and/or
  (ii) a MI from 2 g/10 min to 10 g/10 min, or from 3 g/10 min to 7 g/10 min; and
  (iii) the particles have an average volume diameter from 0.1 microns to 2.0 microns, or from 0.3 to 1.5 microns, or from 0.5 microns to 1.4 microns.

In an embodiment, the microparticles are composed of an MAH functionalized ethylene/octene copolymer (and dispersing agent). The MAH functionalized ethylene/octene copolymer has one, some, or all of the following properties:
  (i) a density from 0.860 g/cc to 0.880 g/cc; and/or
  (ii) a melt index from 600 g/10 min to 700 g/10 min, of from 630 g/10 min to 690 g/10 min; and/or
  (iii) a MWD from 2.0 to 2.2; and
  (iv) the particles have an average volume diameter from 0.1 microns to 2.0 microns, or from 0.3 to 1.5 microns, or from 0.5 microns to 1.4 microns.

The aqueous pigment dispersion is formed by slurrying particles of one or more pigments with water. The pigment particles have an average volume diameter from 0.10 micron to 0.8 microns, or from 0.2 microns to 0.7 microns, or from 3.0 microns to 0.6 microns, or from 0.4 microns to 0.5 microns. Nonlimiting examples of suitable pigment particles include barium sulfate, zinc sulfide, barium carbonate lithopone, zinc phosphate, calcium carbonate, titanium dioxide ($TiO_2$), zinc oxide (ZnO), silicon oxide ($SiO_2$), aluminum oxide ($Al_2O_3$), and combinations thereof.

In an embodiment, the particles of pigment are composed of titanium dioxide ($TIO_2$). Nonlimiting examples of suitable particles of titanium dioxide include TI-PURE™ R-104 $TiO_2$, TI-PURE R-105 $TiO_2$, and TI-PURE™ R-902 available from The Chemours Company ("Chemours").

In an embodiment, the process includes slurrying the pigment particles and a pigment dispersant in water.

In a further embodiment, the process includes slurrying the pigment particles with a pigment dispersant that is a sodium salt of a maleic anhydride copolymer in water.

The aqueous pigment dispersion is mixed with the aqueous polyolefin dispersion to form an aqueous pigment-polyolefin dispersion (or "P-P dispersion"). In the P-P dispersion, the solid particles (pigment particles, polyolefin particles) are uniformly suspended in a continuous aqueous phase. The process includes forming an aqueous polyolefin dispersion having a pH less than 12. The aqueous polyolefin dispersion includes (A) a dispersed polyolefin phase, (B) a dispersing agent, and (C) water, and the dispersed polyolefin phase has a volume average particle size from 0.1 microns to 2.0 microns. The P-P dispersion has a solids content. The "solids content" is the total combined weight of the polyolefin microparticles, the pigment particles, the dispersing agent and the optional pigment dispersant.

In an embodiment, the P-P dispersion has a solids content (i) from 50 wt %, or 60 wt %, or 70 wt % to 90 wt %, or 95 wt % of the polyolefin microparticles; (ii) from 5 wt %, or 10 wt % to 15 wt %, or 20 wt %, or 40 wt % of the pigment particles; (iii) from 1 wt %, or 5 wt % to 15 wt %, or 20 wt % of the dispersing agent; and (iv) from 0 wt %, or 0.05 wt % to 2 wt %, or 5 wt % of the pigment dispersant, based on the total weight of the solids content. It is understood that the polyolefin particles, the dispersing agent, and the optional pigment dispersant amount to 100 wt % of the total weight of the solids content.

In an embodiment, the process includes compounding the pigment particles into the polyolefin and subsequently forming microparticles composed of polyolefin and pigment. The compounding step occurs before or during formation of the aqueous polyolefin dispersion. The process incudes forming an aqueous pigment-polyolefin dispersion having a pH less than 12 and composed of (A) a dispersed polyolefin-pigment phase, (B) a dispersing agent, (C) water. The dispersed pigment-polyolefin phase has a volume average particle size from 0.1 microns to 2.0 microns, or from 0.2 microns to 1.5 microns, or from 0.3 microns to 1.4 microns.

The process includes applying a grid-pattern of the aqueous P-P dispersion onto a rear encapsulant film. The rear encapsulant film is transparent and is composed of an ethylene-based polymer. Nonlimiting examples of suitable ethylene-based polymer for the rear encapsulant film include ethylene homopolymer, ethylene/$C_3$-$C_8$ copolymer, ethylene/$C_4$-$C_8$ copolymer, low density polyethylene (LDPE), linear low density polyethylene (LLDPE), ethylene/diene interpolymers, ethylene/acrylic acid copolymer (EAA), ethylene-vinyl acetate copolymer (EVA), ethylene ethyl acrylate copolymer (EEA), ethylene methyl acrylate copolymer (EMA), ethylene n-butyl acrylate copolymer (EnBA), ethylene methacrylic acid copolymer (EMAA), and combinations thereof.

The grid-pattern of the aqueous P-P dispersion is applied onto the rear encapsulant film by way of screen printing, ink-jet printing, roller printing, tampo printing, and pad printing.

In an embodiment, the grid-pattern of the aqueous P-P dispersion is screen printed onto a facial surface of the rear encapsulant film.

The process includes applying the aqueous P-P dispersion to a rear encapsulant film 10 as shown in FIG. 1. A grid-pattern of the aqueous P-P dispersion is applied to a facial surface of a rear encapsulant film 10. The grid-pattern includes land areas and a grid area. The grid area is a border around the plurality of land areas, the grid area fully surrounding and enclosing each land area to define a plurality of discrete and closed land areas. Each land area is void of the aqueous P-P dispersion. The grid-pattern becomes a grid layer 12, the grid-pattern land areas become land areas 14 of grid layer 12, and the grid-pattern grid area becomes a grid area 16 of grid layer 12 as described below.

The process includes drying the rear encapsulant film (with grid pattern thereon) to form a grid layer. The grid layer is formed from the grid pattern of aqueous P-P dispersion applied onto the rear encapsulant film. The grid layer is formed by drying the grid pattern. The rear encapsulant film with the grid-pattern is placed in an oven at a temperature from 40° C. to 80° C. for a duration from one minute to 60 minutes to remove the water from the aqueous P-P dispersion and to dry the grid-pattern. With the water removed, particles of polyolefin and particles of pigment remain. Drying the grid-pattern at elevated temperature (40° C. to 80° C.) causes the polyolefin particles to soften and coalesce, thereby forming a continuous, or a substantially continuous, grid layer.

In FIG. 1, grid layer 12 has the same, or substantially the same, land areas 14 and grid area 16 as the grid-pattern formed of aqueous P-P dispersion. Grid layer 12 includes grid area 16 that is a substantially continuous, or a continuous, layer composed of particles of polyolefin (and dispersing agent) and particles of pigment from the aqueous P-P dispersion, grid layer 12 formed from the coalescence of the polyolefin particles (from the aqueous dispersion) into a layer. The pigment particles (and pigment dispersant) are also uniformly dispersed throughout the coalesced polyolefin forming the grid layer 12. Land areas 14 are void of the polyolefin (dispersing agent), and void of the pigment (and optional pigment dispersant). The term "gridded rear encapsulant film," as used herein, is a rear encapsulant film with a grid layer adhered thereto, such as rear encapsulant film 10 with grid layer 12 (with land areas 14 and grid area 16) shown in FIG. 1.

In an embodiment, grid layer 12 has a thickness from 1 mil to 10 mil, or from 1 mil to 5 mil. Grid area 16 is composed of from 50 wt % to 90 wt % polyolefin (from 0.5 wt % to 5 wt % dispersing agent) and from 10 wt % to 50 wt % pigment, or from 55 wt % to 90 wt % polyolefin and 45 wt % to 10 wt % pigment (and optional pigment dispersant) based on total weight of the grid layer.

The process includes placing a plurality of PV cells and a front encapsulant film onto the gridded rear encapsulant film to form a stack. A "photovoltaic cell," (or "PV cell") refers to a structure that contains one or more photovoltaic effect materials of any of several inorganic or organic types. Nonlimiting examples of photovoltaic effect material include crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials.

Figure 2:
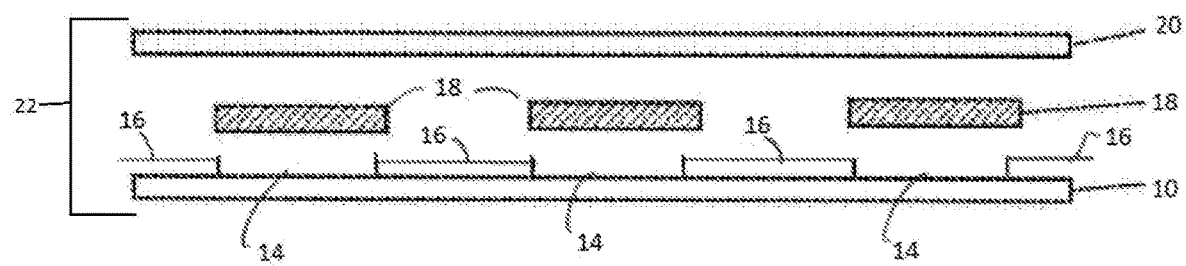
FIG. 2 is an exploded elevation view of a stack with a gridded rear encapsulant film, photovoltaic cells, and a front encapsulant film, in accordance with an embodiment of the present disclosure.

The process includes placing a plurality of photovoltaic cells 18 onto respective land areas 14 of rear encapsulant film 10, as shown in FIG. 2. The photovoltaic cells 18 are spaced apart on the land areas 14 so that grid area 16 is visible between the photovoltaic cells 18, when the rear encapsulant film is viewed from a top plan view. A front encapsulant film 20 subsequently is placed on top of the plurality of photovoltaic cells 18. Front encapsulant film 20 is superimposed upon rear encapsulant film 10 to sandwich photovoltaic cells 18 between rear encapsulant film 10 and front encapsulant film 20. The assembly (moving from bottom to top) includes gridded rear encapsulant film 10, photovoltaic cells 18, and front encapsulant film 20, and forms "a stack," as shown as stack 22 in FIG. 2. Front encapsulant film 20 and rear encapsulant film 10 are typically the same, or substantially the same, size and shape such that when front encapsulant film 20 is placed upon, or otherwise superimposed upon, rear encapsulant film 10 (with photovoltaic cells disposed therebetween), the edges of front encapsulant film 20 and the edges of rear encapsulant film 10 form a common peripheral edge for stack 22.

The front encapsulant film is transparent and can be composed from the same material as the rear encapsulant film or from material different than the material in the rear encapsulant film. In an embodiment, the front encapsulant film is composed of an ethylene-based polymer. Nonlimiting examples of suitable ethylene-based polymer include ethylene homopolymer, ethylene/$C_3$-$C_8$ copolymer, ethylene/$C_4$-$C_8$ copolymer, low density polyethylene (LDPE), linear low density polyethylene (LLDPE), ethylene/diene interpolymers, ethylene/acrylic acid copolymer (EAA), ethylene-vinyl acetate copolymer (EVA), ethylene ethyl acrylate copolymer (EEA), ethylene methyl acrylate copolymer (EMA), ethylene n-butyl acrylate copolymer (EnBA), ethylene methacrylic acid copolymer (EMAA), and combinations thereof.

In an embodiment, rear encapsulant film 10 and front encapsulant film 20 each is composed of a polymeric composition individually selected from ethylene vinyl acetate copolymer (EVA), ethylene methyl methacrylate copolymer, ethylene methacrylate copolymer, propylene-based polymer, ethylene-based polymer, and combinations thereof.

The process includes laminating the stack to form a reflective photovoltaic module. The laminating step includes placing the stack in a laminator. The laminator includes opposing heating metal platens in a vacuum chamber. The stack is placed in the vacuum chamber. The vacuum chamber is closed and air is evacuated from the vacuum chamber. The metal platens apply sufficient heat and sufficient pressure upon the stack, so that the metal platens melt and press, under vacuum, the rear encapsulant film upon the front encapsulant film to fully surround and fully encapsulate the photovoltaic cells 18 within rear encapsulant film 10 and front encapsulant film 20.

In an embodiment, additional structure layers may be added to the stack before lamination. A backsheet may be added under, or otherwise below, rear encapsulant film 10. A tie layer of adhesive material may be present between the backsheet and rear encapsulant film to promote adhesion therebetween. Opposing coversheets, such as a front coversheet placed on the front encapsulant film and a rear coversheet placed below rear encapsulant film 10 may be included in the stack to be laminated (alone or in combination with the backsheet).

The present process is aqueous-based and advantageously avoids the need to melt, or otherwise melt bond, a reflective layer onto an encapsulant film. The present production steps are advantageous because they are minimal compared to conventional processes that require melting and extruding a reflective layer onto the encapsulant film. The present production steps are advantageous because they are simplified and minimal compared to conventional processes that require addition of a reflective backsheet to the PV module.

2. Photovoltaic Module

The present process produces a photovoltaic (PV) module. A PV module is a laminate structure including a PV cell and having at least one light-reactive surface that converts incident light into electric current, typically in outdoor applications. The PV module may also include a front cover sheet, a front encapsulant film, a rear encapsulant film, a backsheet, or a rear cover sheet with the PV cell sandwiched between the front encapsulant film and rear encapsulant film.

In an embodiment, a PV module is provided. The PV module includes a gridded rear encapsulant film, a front encapsulant film, and a plurality of photovoltaic cells sandwiched between the rear encapsulant film and the front encapsulant film. The gridded rear encapsulant film has a facial surface. A grid layer is adhered to the facial surface of the rear encapsulant film. The grid layer has (i) a grid area that is a reflective material composed of a polyolefin and a pigment; and (ii) a plurality of land areas defined by the grid area, each land area void of the reflective material. The PV module includes a plurality of photovoltaic cells, each photovoltaic cell located on a respective land area. In this way, the PV module is a "reflective PV module."

Figure 3:
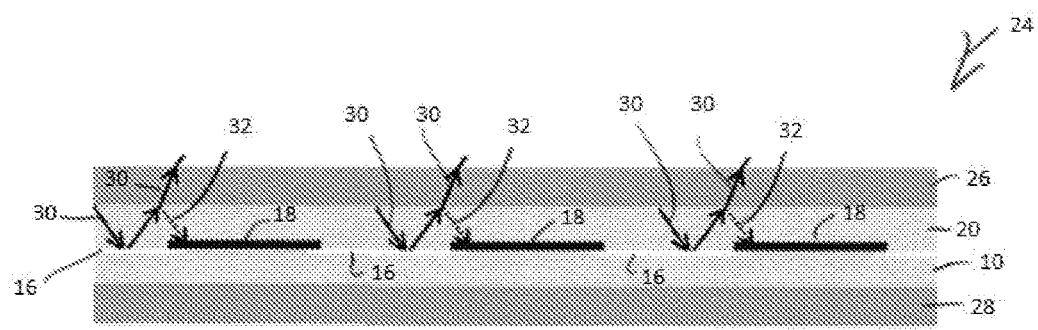
FIG. 3 is an elevation view of a reflective photovoltaic module and grid layer in direct contact with the front encapsulant film and the rear encapsulant film in accordance with an embodiment of the present disclosure.

In an embodiment, a PV module 24 is provided and includes a front cover sheet 26, front encapsulant film 20, photovoltaic cells 18, rear encapsulant film sheet, and a rear cover sheet 28, as shown in FIG. 3. PV cells 18 are surrounded by, or fully encapsulated by, rear encapsulant film 10 and front encapsulant film 20. A front cover sheet 26 covers a front surface the front encapsulant film 20 disposed over PV cells 18. A rear cover sheet 28 supports a rear surface of rear encapsulant film 10 disposed on the rear surface of PV cells 18. Front cover sheet 26 and rear cover sheet 28 each is composed of glass, or acrylic resin, or polycarbonate. In an embodiment, front cover sheet 26 and rear cover sheet 28 each is composed of glass.

In PV module 24, a portion of front encapsulant film 20 directly contacts PV cells 18 and another portion of front encapsulant film 20 directly contacts grid area 16 as shown in FIG. 3. The term "directly contacts" refers to a layer configuration whereby a first layer is located immediately adjacent to a second layer and no intervening layers or no intervening structures are present between the first layer and the second layer. A portion of rear encapsulant film 10 also directly contacts a rear side of PV cells 18. In this way, front encapsulant film 20 and rear encapsulant film 10 fully encapsulate PV cells 18. As shown in FIG. 3, front encapsulant film 20 directly contacts the front cover sheet 26 and rear encapsulant film 10 directly contacts the rear cover sheet 28. PV cells 18 are sandwiched between the front encapsulant film 20 and rear encapsulant film 10 such that the front encapsulant film 20 and rear encapsulant film 10 are both in direct contact with the PV cells 18. The front encapsulant film 20 and rear encapsulant film 10 are also in direct contact with grid area 16.

In a PV module with no reflective grid layer, incident light strikes at the gaps between the PV cells, the incident light passing through the front cover sheet, the front encapsulant film, the rear encapsulant film, the rear cover sheet, eventually leaving the PV module and imparting no light energy onto the PV cell. As shown in FIG. 3, light ray 30 is incident and strikes grid area 16 that is present at the gaps between the PV cells 18. Light ray 30 reflects off of the polyolefin/pigment blend reflective material present in grid area 16, light ray 30 traveling back through front encapsulant film 20 and front cover sheet 26. Residual light ray 32 is created at the front encapsulant film-front cover sheet interface, residual light ray 32 contacting PV cell 18. The additional light impact upon PV cell 18 by residual light 32 improves, or otherwise increases, the conversion efficiency of photovoltaic module 24, compared to the same PV module containing no reflective layer.

Figure 4:
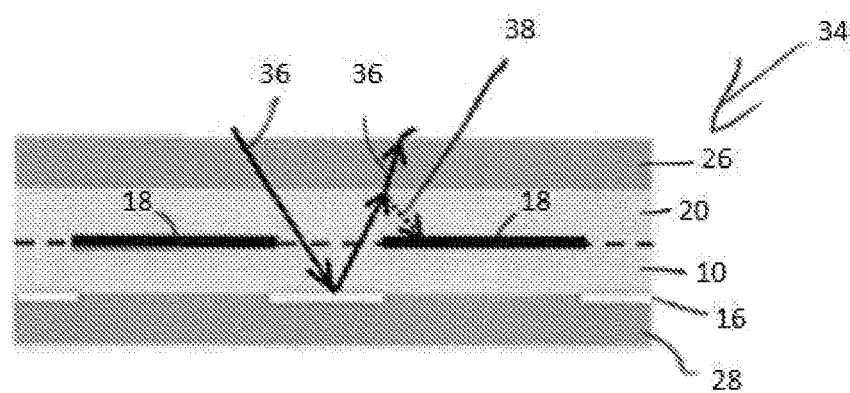
FIG. 4 is an elevation view of a reflective photovoltaic module with grid layer in direct contact with the rear encapsulant film and not in direct contact with the front encapsulant film in accordance with an embodiment of the present disclosure.

In an embodiment, PV module 34 is provided as shown in FIG. 4. PV module 34 includes gridded rear encapsulant film 10 that is inverted, or is otherwise flipped over, such that grid layer 12 is located on the rearmost facial surface of the stack as shown in FIG. 4. In PV module 34, grid layer 12 is not in direct contact with PV cells 18 and grid layer 12 is not in direct contact with front encapsulant film 20. Rather, grid layer 12 is in direct contact with rear coversheet 28 and rear encapsulant film 10. In PV module 34, a portion of front encapsulant film 20 directly contacts PV cells 18 and another portion of front encapsulant film 20 directly contacts rear encapsulant film 10. A portion of rear encapsulant film 10 also directly contacts a rear side of PV cells 18. In this way, front encapsulant film 20 and rear encapsulant film fully encapsulate PV cells 18. As shown in FIG. 4, front encapsulant film 20 directly contacts the front cover sheet 26 and rear encapsulant film 10 directly contacts the rear cover sheet 28. PV cells 18 are sandwiched between the front encapsulant film 20 and rear encapsulant film 10 such that the front encapsulant film 20 and rear encapsulant film 10 are both in direct contact with the PV cells 18.

As shown in FIG. 4, light ray 36 is incident and strikes grid area 16 that is present at the gaps between the PV cells 18. Light ray 36 reflects off of the polyethylene/pigment blend reflective material present in grid area 16, light ray 36 traveling back through rear encapsulant film 10, front encapsulant film 20, and front cover sheet 26. Residual light ray 38 is created at the front encapsulant film-front cover sheet interface, residual light ray 38 contacting PV cell 18. The additional light impact upon PV cell 18 by residual light 38 improves, or otherwise increases, the conversion efficiency of photovoltaic module 34, compared to the same PV module containing no reflective layer.

In an embodiment, the photovoltaic module includes:
(A) a front cover sheet;
(B) a front encapsulant film composed of a polymeric material selected from
  (i) an ethylene/$C_4$-$C_8$ α-olefin copolymer having a density from 0.850 g/cc to 0.900 g/cc and an MI from 1 g/10 min to 100 g/10 min; and/or
  (ii) an ethylene polymer copolymer having a comonomer content from 10 wt % to 40 wt % (based on total weight of the copolymer) and an MI from 1 g/10 min to 100 g/10 min and selected from ethylene/vinyl acetate copolymer, ethylene/methyl acrylate copolymer, ethylene/butyl acrylate copolymer;
(C) a photovoltaic cell;
(D) a gridded rear encapsulant film having
  (i) a rear encapsulant film composed of a polymeric material selected from
    (a) an ethylene/$C_4$-$C_8$ α-olefin copolymer having a density from 0.850 g/cc to 0.900 g/cc and an MI from 1 g/10 min to 100 g/10 min; and/or
    (b) an ethylene polymer copolymer having a comonomer content from 10 wt % to 40 wt % (based on total weight of the copolymer) and an MI from 1 g/10 min to 100 g/10 min and selected from ethylene/vinyl acetate copolymer, ethylene/methyl acrylate copolymer, ethylene/butyl acrylate copolymer,
  (ii) a grid layer having a grid area composed of a blend of a polyolefin, a dispersant, and titanium dioxide;
(E) a rear cover sheet; and
the photovoltaic module has a Pmax/W value from 3 W to 6 W or from 4.0 W to 5.9 W.

In an embodiment, the photovoltaic module includes:
(A) a front cover sheet;
(B) a front encapsulant film composed of a polymeric material selected from
  (i) an ethylene/$C_4$-$C_8$ α-olefin copolymer having a density from 0.850 g/cc to 0.900 g/cc and an MI from 1 g/10 min to 100 g/10 min; (C) a photovoltaic cell;
  (D) a gridded rear encapsulant film having
(i) a rear encapsulant film composed of a polymeric material selected from (a) an ethylene/$C_4$-$C_8$ α-olefin copolymer having a density from 0.850 g/cc to 0.900 g/cc and an MI from 1 g/10 min to 100 g/10 min,
(ii) a grid layer having a grid area composed of a blend selected from
  (a) propylene/ethylene copolymer, ethylene acrylic acid copolymer (dispersing agent), and titanium dioxide; or
  (b) ethylene/propylene/diene terpolymer and ethylene acrylic acid copolymer (dispersing agent), and titanium dioxide; or
  (c) ethylene/octene multi-block copolymer and ethylene acrylic acid copolymer (dispersing agent); or
  (d) ethylene/octene copolymer and ethylene methacrylic acid copolymer (dispersing agent), and titanium dioxide; or
  (e) MAH-functionalized ethylene/octene copolymer and a $C_{18}$-$C_{26}$ carboxylic acid (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, or from greater than 5.0 W to 5.3 W.

In an embodiment, the photovoltaic module includes:
(A) a front cover sheet;
(B) a front encapsulant film composed of a polymeric material selected from
  (i) an ethylene/$C_4$-$C_8$ α-olefin copolymer having a density from 0.850 g/cc to 0.900 g/cc and an MI from 1 g/10 min to 100 g/10 min;
(C) a photovoltaic cell;
(D) a gridded rear encapsulant film having
  (i) a rear encapsulant film composed of a polymeric material selected from
    (a) an ethylene/$C_4$-$C_8$ α-olefin copolymer having a density from 0.850 g/cc to 0.900 g/cc and an MI from 1 g/10 min to 100 g/10 min,
  (ii) a grid layer having a grid area composed of a blend selected from propylene/ethylene copolymer, ethylene acrylic acid copolymer (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, of from greater than 5.0 W to 5.3 W.

In an embodiment, the photovoltaic module includes:
(A) a front cover sheet;
(B) a front encapsulant film composed of a polymeric material selected from
  (i) an ethylene/$C_4$-$C_8$ α-olefin copolymer having a density from 0.850 g/cc to 0.900 g/cc and an MI from 1 g/10 min to 100 g/10 min;
(C) a photovoltaic cell;
(D) a gridded rear encapsulant film having
  (i) a rear encapsulant film composed of a polymeric material selected from
    (a) an ethylene/$C_4$-$C_8$ α-olefin copolymer having a density from 0.850 g/cc to 0.900 g/cc and an MI from 1 g/10 min to 100 g/10 min,
  (ii) a grid layer having a grid area composed of a blend selected from ethylene/propylene/diene terpolymer and ethylene acrylic acid copolymer (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, of from greater than 5.0 W to 5.3 W.

In an embodiment, the photovoltaic module includes:
(A) a front cover sheet;
(B) a front encapsulant film composed of a polymeric material selected from
  (i) an ethylene/$C_4$-$C_8$ α-olefin copolymer having a density from 0.850 g/cc to 0.900 g/cc and an MI from 1 g/10 min to 100 g/10 min;
(C) a photovoltaic cell;
(D) a gridded rear encapsulant film having
  (i) a rear encapsulant film composed of a polymeric material selected from
    (a) an ethylene/$C_4$-$C_8$ α-olefin copolymer having a density from 0.850 g/cc to 0.900 g/cc and an MI from 1 g/10 min to 100 g/10 min,
  (ii) a grid layer having a grid area composed of a blend selected from ethylene/octene multi-block copolymer and ethylene acrylic acid copolymer (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, of from greater than 5.0 W to 5.3 W.

In an embodiment, the photovoltaic module includes:
(A) a front cover sheet;
(B) a front encapsulant film composed of a polymeric material selected from
   (i) an ethylene/$C_4$-$C_8$ α-olefin copolymer having a density from 0.850 g/cc to 0.900 g/cc and an MI from 1 g/10 min to 100 g/10 min;
(C) a photovoltaic cell;
(D) a gridded rear encapsulant film having
   (i) a rear encapsulant film composed of a polymeric material selected from
      (a) an ethylene/$C_4$-$C_8$ α-olefin copolymer having a density from 0.850 g/cc to 0.900 g/cc and an MI from 1 g/10 min to 100 g/10 min,
   (ii) a grid layer having a grid area composed of a blend selected from ethylene/octene copolymer and ethylene methacrylic acid copolymer (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, of from greater than 5.0 W to 5.3 W.

In an embodiment, the photovoltaic module includes:
(A) a front cover sheet;
(B) a front encapsulant film composed of a polymeric material selected from
   (i) an ethylene/$C_4$-$C_8$ α-olefin copolymer having a density from 0.850 g/cc to 0.900 g/cc and an MI from 1 g/10 min to 100 g/10 min;
(C) a photovoltaic cell;
(D) a gridded rear encapsulant film having
   (i) a rear encapsulant film composed of a polymeric material selected from
      (a) an ethylene/$C_4$-$C_8$ α-olefin copolymer having a density from 0.850 g/cc to 0.900 g/cc and an MI from 1 g/10 min to 100 g/10 min,
   (ii) a grid layer having a grid area composed of a blend selected from MAH-functionalized ethylene/octene copolymer and a Cis-$C_{26}$ carboxylic acid (dispersing agent), and titanium dioxide;
(E) a rear cover sheet; and
the photovoltaic module has a Pmax/W value from 3 W to 6 W. In an embodiment, the PV module is a bifacial PV module and has a Pmax/W value from 5.0 W to 5.5 W, of from greater than 5.0 W to 5.3 W.

By way of example, and not limitation, some embodiments of the present disclosure will now be described in detail in the following Examples.

EXAMPLES

Materials used in the examples are provided in Tables 1A and 1B below.

TABLE 1A

| Material/Description | Properties | Source |
| --- | --- | --- |
| Ti-Pure ™ R902 | $TiO_2$ Volume Average Diameter = 0.42 um | Chemours |
| Orotan ™ 731A | Pigment dispersant, 25% solid sodium salt of a maleic anhydride copolymer | Dow Inc. |
| Versify ™ 3200 | Propylene/Ethylene copolymer MFR = 8 | Dow Inc. |
| Nordel ™ 4725P | Ethylene/Propylene/Diene copolymer Mooney viscosity = 25 | Dow Inc. |
| INFUSE ™ 9500 | Ethylene/1-Octene block copolymer MI = 5 | Dow Inc. |
| ENGAGE ™ 8200 | Ethylene/1-Octene copolymer MI = 5 | Dow Inc. |
| AFFINITY ™ 1000R | Maleic anhydride grafted polyolefin elastomer MI = 660 | Dow Inc. |
| Primacor ™ 5980i | Ethylene acrylic acid copolymer MI = 300, acrylic acid content = 20.5% | SK Chemical |
| Nucrel ™ 960 | Ethylene methacrylic acid copolymer MI = 60, methacrylic acid content = 15% | Dow Inc. |
| Licocene ™ 4351 | Maleic anhydride grafted polyethylene Acid value = 42-49 mgKOH/g | Clariant |
| Unicid ™ 350 | $C_{26}$ carboxylic acid Acid value = 120 mgKOH/g | Baker Hughes |
| BAYDERM FINISH 91 UD | Aqueous Polyurethane (PU) dispersion, 40% solid | Dow Inc. |

TABLE 1B

| Material/Description | Properties | Source |
| --- | --- | --- |
| PERC-1 | Photovoltaic cell Passivated emitter and rear cell (PERC) | Aixu |
| PERC-2 | Photovoltaic cell Passivated emitter and rear cell (PERC) | Tongwei |
| Single facial | Photovoltaic cell | JA solar |
| TOPCON | Photovoltaic cell | Jolywood |

TABLE 1B-continued

| Material/Description | Properties | Source |
|---|---|---|
| POE encapsulation film | Transparent Hangzhou FIRST TF4 POE film<br>POE = transparent ethylene/octene copolymer film | Hangzhou |
| EVA encapsulation film | Hangzhou FIRST F406P film<br>Transparent ethylene/vinyl acetate copolymer film | Hangzhou |

Experiment Procedure:
1. Preparation of Aqueous Polyolefin Dispersion

Dispersion A is made from a thermoplastic propylene/ethylene copolymer (Versify, 3200, Dow Inc.). The propylene/ethylene copolymer was dispersed into water by an extruding process as described in U.S. Pat. No. 7,947,776. Potassium hydroxide neutralized ethylene acrylic acid copolymer (Primacor™ 5980i, SK Chemical) was used as dispersing agent. The polymer to dispersing agent ratio is 85/15 and the final nonvolatile content is 55%. The dispersed polymer phase measured by a Coulter LS230 particle analyzer has an average volume diameter of 0.86 micron.

Dispersion B is made from a thermoplastic ethylene/propylene/diene copolymer (Nordel™ 4725P, Dow Inc.). The ethylene/propylene/diene terpolymer was dispersed into water by an extruding process as described in U.S. Pat. No. 7,947,776. Potassium hydroxide neutralized ethylene acrylic acid copolymer (Primacor™ 5980i, SK Chemical) was used as dispersing agent. The polymer to dispersing agent ratio is 80/20 and the final nonvolatile content is 46%. The dispersed polymer phase measured by a Coulter LS230 particle analyzer has an average volume diameter of 1.24 micron.

Dispersion C is made from a thermoplastic ethylene/octene multi-block copolymer (INFUSE™ 9500, Dow Inc.). The ethylene/octane multi-block copolymer was dispersed into water by an extruding process as described in U.S. Pat. No. 7,947,776. Dimethylethanolamine neutralized ethylene acrylic acid copolymer (Primacor™ 5980i, SK Chemical) was used as dispersing agent. The polymer to dispersing agent ratio is 80/20 and the final nonvolatile content is 50%. The dispersed polymer phase measured by a Coulter LS230 particle analyzer has an average volume diameter of 0.56 micron.

Dispersion D is made from a thermoplastic ethylene/octene copolymer (ENGAGE™ 8200, Dow Inc.). The ethylene/octane copolymer was dispersed into water by an extruding process as described in U.S. Pat. No. 7,947,776. Potassium hydroxide neutralized ethylene methacrylic acid copolymer (Nucrel™ 960, Dow Inc.) and maleic anhydride grafted polyethylene wax (Licocene™ 4351, Clariant) were used as dispersing agent. The polymer to dispersing agent ratio is 70/30 and the final nonvolatile content is 44%. The dispersed polymer phase measured by a Coulter LS230 particle analyzer has an average volume diameter of 1.09 micron.

Dispersion E is made from a thermoplastic maleic anhydride grafted polyolefin elastomer (AFFINITY™ 1000R, Dow Inc.). The maleic anhydride grafted polyolefin elastomer was dispersed into water by an extruding process as described in U.S. Pat. No. 7,947,776. Potassium hydroxide neutralized C26 carboxylic acid (Unicid 350, Baker Hughes) was used as dispersing agent. The polymer to dispersing agent ratio is 95/5 and the final nonvolatile content is 40%. The dispersed polymer phase measured by a Coulter LS230 particle analyzer has an average volume diameter of 0.21 micron.

2. Preparation of Aqueous Pigment Dispersion

R902 slurry preparation method: Add 90 g R902 $TiO_2$ (Volume Average Particle Size=0.42 microns, Chemours) and 1.2 g Orotan 731A (sodium salt of a maleic anhydride as dispersant, Dow Inc.) into 60 g water, and stir the mixture under 1000RPM for 5 minutes to form a 60% $TiO_2$ slurry that is the aqueous pigment dispersion.

3. Formulating the P-P Aqueous Dispersion

The aqueous P-P dispersion examples were formulated by mixing one of Dispersion A, B, D, or E each with the aqueous pigment dispersion ($TiO_2$ slurry) together under 1000 rpm for 5 minutes to form P-P 1, P-P 3, P-P 5, and P-P 6. In addition, aqueous PU dispersion is mixed with the aqueous pigment dispersion and each of Dispersion A and Dispersion C together under 1000 rpm for 5 minutes to form P-P 2 and P-P 4. The compositions for each of P-P1 through P-P 6 are provided in Table 2 below. detailed composition can be found in Table 2.

TABLE 2 formulation of P-P aqueous dispersion examples

| Sample No. | Dispersion | Dispersion Weight/g | R902 slurry weight/g | 91UD weight/g | $TiO_2$/Polymer |
|---|---|---|---|---|---|
| P-P 1 | Dispersion A | 30 | 4.2 | | 15% |
| P-P 2 | Dispersion A | 27 | 4.2 | 3 | 15% |
| P-P 3 | Dispersion B | 30 | 4.6 | | 20% |
| P-P 4 | Dispersion C | 25 | 4.4 | 5 | 20% |
| P-P 5 | Dispersion D | 30 | 5.0 | | 20% |
| P-P 6 | Dispersion E | 30 | 4.0 | | 20% |

4. Screen Printing the Grid Layer

The formulated P-P aqueous dispersion was then screen printed on the rear encapsulant film and subsequently dried at 60° C. for 20 minutes to form the gridded rear encapsulant film.

5. Preparation of PV Module

The glass/glass bifacial PV modules were prepared with the following procedures.

The photovoltaic embossed glass with a size of 25 cm by 25 cm were cleaned using water and then dried before use. The base films used were commercialized POE or EVA films with adhesion to glass (higher than 80 N/cm), high transparency (higher than 89%) and other properties required for a commercialized PV encapsulant film. The POE and EVA base films were cut to fit the size of the photovoltaic embossed glass. Afterward, front glass/encapsulant film/soldered solar cell/grid pattern encapsulant film/rear glass were stacked together in sequence into a sandwich structure, which was then rimmed using a scotch tape with holes in the middle.

The lamination was conducted on a Shunhong SH-X-1000 laminator at 150° C. for 20 minutes, including 4 minutes vacuum process and 16 minutes pressing. Afterwards, the PV modules were removed from the laminator and cooled at room temperature.

Pmax/W values were measured with results shown in Table 3 below. Pmax values were measured by a BERGER solar simulator at standard test condition, 1000 W/m² light, at 25° C. For each sample, Pmax/W was measured three times with the average Pmax/W value shown in Table 3 below.

TABLE 3

Average Pmax/W values for photovoltaic modules

| Cells | Samples | Rear encapsulant film | Ave Pmax with STDEV/W |
|---|---|---|---|
| Bifacial PERC-1 | Control sample | Transparent POE film | 5.71 |
|  | Inventive Example 1 | POE gridded rear encapsulant film by P-P 1 | 5.85 |
| Bifacial PERC-2 | Control sample | Transparent POE film | 5.01 |
|  | Inventive Example 2 | POE gridded rear encapsulant film by P-P 2 | 5.22 |
|  | Inventive Example 3 | POE gridded rear encapsulant film by P-P 3 | 5.19 |
|  | Inventive Example 4 | POE gridded rear encapsulant film by P-P 4 | 5.20 |
|  | Inventive Example 5 | POE gridded rear encapsulant film by P-P 5 | 5.22 |
|  | Inventive Example 6 | POE gridded rear encapsulant film by P-P 6 | 5.17 |
| Single facial PERC | Control sample | Transparent POE film | 4.64 |
|  | Inventive Example 7 | POE gridded rear encapsulant film by P-P 1 | 4.80 |
| N-Topcon | Control sample | Transparent POE film | 4.51 |
|  | Inventive Example 8 | POE gridded rear encapsulant film by P-P 1 | 4.72 |

For two types of PERC bifacial cells, one type of single facial PERC cell, and one type of N-Topcon cell, the power output of PV modules is improved by 0.14-0.22 W per PV module, ranging from 2.42% to 4.56% per module by way of POE gridded rear encapsulant film inventive examples 1-8.

It is specifically intended that the present disclosure not be limited to the embodiments and illustrations contained herein, but include modified forms of those embodiments including portions of the embodiments and combinations of elements of different embodiments as come within the scope of the following claims.

The invention claimed is:

1. A process comprising:
   providing an aqueous pigment-polyolefin dispersion (P-P dispersion) comprising
   a polyolefin,
   a pigment, and
   a dispersing agent selected from the group consisting of a long chain $C_{12}$-$C_{40}$ fatty acid, ethylene(meth)acrylic acid, sulfonic acid, and combinations thereof;
   applying a grid-pattern of the aqueous P-P dispersion onto a rear encapsulant film; and
   drying the grid-pattern into a grid layer to form a gridded rear encapsulant film.

2. The process of claim 1 wherein the applying comprises screen printing a grid-pattern of the aqueous P-P dispersion onto the rear encapsulant film.

3. The process of claim 1 wherein the drying comprises
   forming a grid layer having a plurality of land areas and a grid area, and
   forming the grid area as a continuous layer of a blend of the polyolefin and the pigment.

4. The process of claim 3 comprising
   placing a plurality of photovoltaic cells on respective plurality of land areas.

5. The process of any claim 4 comprising
   placing a front encapsulant film onto the PV cells and the gridded rear encapsulant film to form a stack; and
   laminating the stack to form a reflective photovoltaic (PV) module.

6. The process of claim 1 wherein the polyolefin is selected from the group consisting of propylene/ethylene copolymer, ethylene/propylene/diene terpolymer, ethylene/octene copolymer, ethylene/octene multi-block copolymer, maleic anhydride-functionalized ethylene/octene polymer, and combinations thereof.

7. A process comprising:
   forming an aqueous polyolefin dispersion having a pH less than 12 and comprising
   (A) a dispersed polyolefin phase,
   (B) a dispersing agent, and
   (C) water, and the dispersed polyolefin phase has a volume average particle size from 0.1 microns to 2.0 microns;
   providing an aqueous pigment dispersion;
   mixing the aqueous polyolefin dispersion with the aqueous pigment dispersion to form an aqueous pigment-polyolefin dispersion (P-P dispersion);
   applying a grid-pattern of the aqueous P-P dispersion onto a rear encapsulant film; and
   drying the grid-pattern into a grid layer to form a gridded rear encapsulant film.

8. The process of claim 7 comprising slurrying pigment particles with a pigment dispersing agent and water to form the aqueous pigment dispersion.

9. A process comprising:

compounding pigment particles with a polyolefin;

forming an aqueous pigment-polyolefin dispersion (P-P dispersion) having a pH less than 12 and comprising (A) a dispersed polyolefin-pigment phase, (B) a dispersing agent, (C) water, and the dispersed pigment-polyolefin phase has a volume average particle size from 0.1 microns to 2.0 microns;

applying a grid-pattern of the aqueous P-P dispersion onto a rear encapsulant film; and drying the grid-pattern into a grid layer to form a gridded rear encapsulant film.

* * * * *